United States Patent
Kim et al.

(10) Patent No.: US 7,406,648 B2
(45) Date of Patent: Jul. 29, 2008

(54) METHODS FOR CODING AND DECODING LDPC CODES, AND METHOD FOR FORMING LDPC PARITY CHECK MATRIX

(75) Inventors: Jung Hoon Kim, Daejeon-Shi (KR); Young Jo Ko, Daejeon-Shi (KR)

(73) Assignee: Electronics and Telecommunications Research Institute, Daejon-shi (KR)

( * ) Notice: Subject to any disclaimer, the term of this patent is extended or adjusted under 35 U.S.C. 154(b) by 376 days.

(21) Appl. No.: 10/970,001

(22) Filed: Oct. 22, 2004

(65) Prior Publication Data

US 2005/0144549 A1 Jun. 30, 2005

(30) Foreign Application Priority Data

Dec. 24, 2003 (KR) .................. 10-2003-0096036
Aug. 12, 2004 (KR) .................. 10-2004-0063377

(51) Int. Cl.
*H03M 13/00* (2006.01)

(52) U.S. Cl. ..................... 714/758; 714/801

(58) Field of Classification Search ............. 714/758, 714/801
See application file for complete search history.

(56) References Cited

U.S. PATENT DOCUMENTS

| | | | | |
|---|---|---|---|---|
| 6,633,856 | B2 * | 10/2003 | Richardson et al. | 706/15 |
| 6,789,227 | B2 * | 9/2004 | De Souza et al. | 714/804 |
| 6,895,547 | B2 * | 5/2005 | Eleftheriou et al. | 714/801 |
| 2002/0051501 | A1 * | 5/2002 | Demjanenko et al. | 375/298 |
| 2005/0149840 | A1 * | 7/2005 | Lee et al. | 714/800 |
| 2005/0160351 | A1 * | 7/2005 | Ko et al. | 714/801 |
| 2005/0180500 | A1 * | 8/2005 | Chiang et al. | 375/240 |

OTHER PUBLICATIONS

Sarah J. Johnson, Constraining LDPC Degree Distributions for Improved Error Flooring Performance, Feb. 2, 2006, IEEE, vol. 10, No. 2.*
Thomas J. Richardson, Efficient Encoding of Low-Density Parity-Check Codes, Feb. 2, 2001, IEEE, vol. 47, No. 2.*
Michael G. Luby, et al.; "Efficient Erasure Correcting Codes"; IEEE Transactions on Information Theory, vol. 47, No. 2, Feb. 2001; pp. 569-584.
Peter Oswald, et al.; "Capacity-Achieving Sequences for the Erasure Channel"; IEEE Transactions on Information Theory, vol. 48, No. 12, Dec. 2002; pp. 3017-3028.
Albert et al.; "Statistical mechanics of complex networks"; Reviews of Modern Physics; Jan. 2002; pp. 47-97.

* cited by examiner

*Primary Examiner*—M. Mujtaba K. Chaudry
(74) *Attorney, Agent, or Firm*—Lowe Hauptman Ham & Berner LLP

(57) ABSTRACT

Provided are methods for encoding and decoding low-density parity-check (LDPC) codes and a method for forming an LDPC parity check matrix. The method for forming the LDPC parity check matrix, includes the steps of: preparing a plurality of parity check matrixes; and selecting a parity check matrix having maximum performance from the prepared parity check matrixes, wherein the parity check matrix has a degree distribution $G(x)$ that meets an equation, $$G(x) = \sum_{k=2}^{d_i-1} a_k x^k + \sum_{k=d_i}^{d_{max}} Ck^{-\gamma} x^k \text{ or } G(x) = \sum_{k=2}^{d_{max}} C(k+\alpha)^{-\gamma} x^k,$$

where, $a_k$ is a parameter that corresponds to the probability that nodes of the graph have a degree k, C is a parameter that is determined by a normalization condition, $G(1)=1$, and $\alpha, \gamma$ are parameters that is optimized through numerical calculations. This may significantly decrease a time to discover an optimal code by using a power-law distribution with less parameters in designing the LDPC codes, as compared with numerical optimization in a global parameter space.

14 Claims, 6 Drawing Sheets

FIG. 1

(PRIOR ART)

$a = [0100]$ $G = \begin{bmatrix} 1101000 \\ 0010100 \\ 1110010 \\ 1010001 \end{bmatrix}$ $c = aG = [0010100]$ $H = \begin{bmatrix} 1001011 \\ 0101010 \\ 0010111 \end{bmatrix}$ $0 = CH^T = [000]$

METHODS FOR CODING AND DECODING LDPC CODES, AND METHOD FOR FORMING LDPC PARITY CHECK MATRIX

BACKGROUND

1. Field of the Invention

The present invention relates to methods for coding and decoding low-density parity-check (LDPC) codes and a method for forming an LDPC parity check matrix, more particularly, to methods for coding and decoding LDPC codes and a method for forming an LDPC parity check matrix using a parity check matrix, which has a degree distribution conforming to a power-law function.

2. Discussion of Related Art

An LDPC code introduced first by Gallager in 1962 is a linear block code in which most of elements of a parity check matrix are zero. Related contents are described in "R. G. Gallager, Low-Density Parity-Check code," IRE Trans. Inform. Theory, vol. IT-8, pp. 21-28, January 1962. However, the code was forgotten for a long time because it was difficult to implement a decoder with technologies at that time, and then has been rediscovered by Mackay, et al. Related contents are described in "D. J. C. MacKay, Good error correcting codes based on very sparse matrices," IEEE Trans. Inform. Theory, vol. 45, pp. 399-431, March 1999. Iterative decoding using sum-product (summation and multiplication) algorithms allows such an LDPC code to hold excellent error recovery performance. In particular, it has been shown (ascertained) that if the LDPC code is configured to be not uniform, namely, an irregular LDPC code, it results in excellent performance over a turbo code. Related contents are described in "T. J. Richardson, M. A. Shokrollashi, and R. L. Urbanke, Design of capacity approaching irregular low-density parity-check codes," IEEE Trans. Inform. Theory, vol. 47, no. 2, pp. 619-637, February 2001. The performance of the LDPC code is generally determined by a configuration of the parity check matrix.

The encoding of the LDPC code can be achieved by an equation of c=aG. In the equation, c means an encoded code vector, a is an information vector, and G corresponds to a parity generation matrix. The parity generation matrix G and the parity check matrix H satisfy an equation, $cH^T=aGH^T=O$, for all codewords c or all information vectors a. In the equation, O means a zero vector. In FIG. 1, denoted are examples of the information vector a, the parity generation matrix G, the code vector c, the parity check matrix H, and the zero vector O.

The decoding of the LDPC codes may use a bipartite graph depicted in FIG. 2. The bipartite graph in FIG. 2 corresponds to the parity check matrix shown in FIG. 1. The bipartite graph is composed of check nodes 110 and variable nodes 120, and the variable nodes 120 are composed of information nodes 122 and parity nodes 124. The number of the check nodes 110 is equal to the number of rows in the parity check matrix, and the number of the variable node 120 is equal to the number of columns in the parity check matrix, namely, a length of the code vector. Lines that connect between the check node 110 and the variable node 120 are called edges 130. The edges insertions follow the positions of 1 s of the parity matrix. For example, since there are 1 s at the first, fourth, sixth and seventh columns of the first row in the parity check matrix H of FIG. 1, the first check node of FIG. 2 is connected to the first, fourth, sixth and seventh variable nodes by the edges. Decoding of the LDPC codes is done by an iterative belief propagation via the edge nodes between the check nodes 110 and the variable nodes 120. Related contents are described in "D. J. C MacKay, Good error correcting codes based on very sparse matrices," IEEE Trans. Inform. Theory, vol. 45. pp. 399-431, March 1999.

Design of a good connection structure of a bipartite graph, on which the LDPC code is based, is of prime importance in constructing the LDPC codes. This is because the connection structure between nodes in the graph directly determines the performance of the LDPC code. An LDPC code may be represented by a bipartite graph consisting of variable nodes and check nodes, as described above. The number of edges connected to the node is called the degree of the node. It is known that the performance of codes formulated on the graph is determined by the degree distribution of the graph on the assumption that the graph is a random graph having a tree structure and does not have a cycle therein. Given the degree distribution of the graph, the performance of the graph can be calculated by the density evolution method developed by Richardson, et al. Related contents are described in "T. J. Richardson, R. L. Urbanke, IEEE Trans. Inform. Theory 47, 599, 2001" and "T. J. Richardson, M. A. Shokrollahi, R. L. Urbanke, IEEE Trans. Inform. Theory 47, 619, 2001."

A conventional method for designing the connection structure of the graph, namely, constructing a parity check matrix used for the LDPC codes includes the degree optimization though numerical calculation. On the other hand, codes that provide mathematic expressions for the degree distribution include Tornado code developed by Luby, et al., a right-regular sequence of Shokrollahi, and the like. However, such formation of the LDPC codes according to the prior art requires massive numerical computation and finding an optimal solution is not a feasible task, as is similar to a typical global optimization problem.

SUMMARY OF THE INVENTION

The present invention is directed to a method for forming a parity check matrix that is used for LDPC codes, an encoder and a decoder for the LDPC code using the same, in which a time required for the code optimization is significantly reduced.

According to the first aspect of the present invention, there is provided a method for encoding LDPC codes, comprised of the steps of: preparing a parity generation matrix; and forming a code vector by multiplying an information vector, which is source data to be coded, by the parity generation matrix, wherein the parity generation matrix meets an equation, $O=aGH^T$, where, O is a zero vector, a is an arbitrary information vector, G is a parity generation matrix, and H is a parity check matrix, and the parity check matrix has a degree distribution $G(x)$ given by the following equation:

$$G(x) = \sum_{k=2}^{d_i-1} a_k x^k + \sum_{k=d_i}^{d_{max}} Ck^{-\gamma} x^k \text{ or } G(x) = \sum_{k=2}^{d_{max}} C(k+\alpha)^{-\gamma} x^k,$$

where, $a_k$ is a parameter that corresponds to the probability that nodes of the graph have a degree k, C is a parameter that is determined by a normalization condition, $G(1)=1$, and $\alpha$, $\gamma$ are parameters that is optimized through numerical calculations.

According to the second aspect of the present invention, there is provided a method for decoding an LDPC code, comprising the steps of: preparing a parity check matrix; and obtaining an information vector from the parity check matrix and a received code vector, wherein the parity check matrix has a degree distribution G(x) given by the following equation, $$G(x) = \sum_{k=2}^{d_l-1} a_k x^k + \sum_{k=d_l}^{d_{max}} Ck^{-\gamma}x^k \text{ or } G(x) = \sum_{k=2}^{d_{max}} C(k+\alpha)^{-\gamma}x^k,$$

where, $a_k$ is a parameter that corresponds to the probability that nodes of the graph have a degree k, C is a parameter that is determined by a normalization condition, $G(1)=1$, and $\alpha$, $\gamma$ are parameters that is optimized through numerical calculations.

According to the third aspect of the present invention, there is provided a method for forming an LDPC parity check matrix, comprising the steps of: preparing a plurality of parity check matrixes; and selecting a parity check matrix having maximum performance from the prepared parity check matrixes, wherein: the parity check matrix has a degree distribution G(x) given by the following equation:

$$G(x) = \sum_{k=2}^{d_l-1} a_k x^k + \sum_{k=d_l}^{d_{max}} Ck^{-\gamma}x^k \text{ or } G(x) = \sum_{k=2}^{d_{max}} C(k+\alpha)^{-\gamma}x^k,$$

where, $a_k$ is a parameter that corresponds to the probability that nodes of the graph have a degree k, C is a parameter that is determined by a normalization condition, $G(1)=1$, and $\alpha$, $\gamma$ are parameters that is optimized through numerical calculations.

Hereinafter, theoretic background of the present invention will be described.

The present invention utilizes a scale-free network, which has a degree distribution conforming to a power-law function, as a basis graph for LDPC codes. Related explanations are described in "R. Albert, A. L. Barabasi, Rev. Mod. Phys. 74, 47, 2002." In many cases, actual complex networks have an inter-node connection distribution conforming to a power-law function. Such a network is called a scale-free network, and an example of the scale-free network includes Internet and World Wide Web, as well as a society network such as a co-writer network, and biological networks such as a metabolism network, a protein network, and the like.

The degree distribution G(x) of a typical graph may be simply expressed by Equation 1:

$$G(x) = \sum_{k=2}^{d_{max}} a_k x^k \quad \text{[Equation 1]}$$

In the above equation, $a_k$ corresponds to the probability that nodes of the graph have a degree k, and thus $G(1)=1$. The summation of the equation begins with $k=2$, since nodes having a degree smaller than 2 do not contribute to error correction.

In the case of the scale-free network, the degree distribution G(x) is in the form of Equation 2.

[Equation 2]

$$G(x) = \sum_{k=2}^{d_l-1} a_k x^k + \sum_{k=d_l}^{d_{max}} Ck^{-\gamma}x^k \quad \text{[Equation 2]}$$

where, $a_k$ is a parameter that corresponds to the probability that nodes of the graph have a degree k, C is a parameter that is determined by a normalization condition, $G(1)=1$, and $\alpha$, $\gamma$ are parameters that is optimized through numerical calculations, and nodes having a degree of $k \geq d_l$ have a degree distribution conforming to the power-law function. Note that in the above equation, the degree distribution of nodes having a degree smaller than $d_l$ may not conform to the power-law function. In a normal actual scale-free network, its degree distribution conforms to the power-law function at large degrees, but not at small degrees. Likewise, even in the case of the scale-free network used in the present invention, there is a likelihood that the degree distribution may not exactly conform to power-law distribution in the region where the degree is small.

Although the degree distribution in Equation 2 may be used as it is, a degree distribution in a more simplified form represented by Equation 3 may be used:

$$G(x) = \sum_{k=2}^{d_{max}} C(k+\alpha)^{-\gamma}x^k \quad \text{[Equation 3]}$$

There is an advantage that the degree distribution represented by Equation 3 has fewer parameters than those of the degree distribution represented by Equation 2. That is, in the case of Equation 2, optimization is difficult since it includes a large number of parameters (a2, a3, ..., $a_{d_l-1}$) while in the case of Equation 3, actual code optimization may be performed in a two-dimensional parameter space composed of parameters $\alpha$ and $\gamma$ since the equation includes only three parameters ($\alpha$, $\gamma$, C), in which C can be determined by a normalization condition, namely, $G(1)=1$.

The check nodes of the graph have a degree distribution defined by Equation 4:

$$F(x) = bx^k + (1-b)x^{k+1} \quad \text{[Equation 4]}$$

In Equation 4, F(x) meets the normalization condition $F(1)=1$ as G(x), and b and k are parameters that are automatically determined when a degree distribution of variable nodes is given.

Encoding of the code may be performed using a belief propagation algorithm, which is commonly used in decoding the LDPC codes. Through numerical calculations, optimized $\alpha$ and $\gamma$ or b and k, giving the maximum performance can be found.

The performance of the LDPC codes on a binary erasure channel may be calculated by the density evolution method developed by Luby, Richardson, et al., as described below. Hereinafter, the density evolution method will be discussed. Assuming that $\delta$ is erasure probability of a given erasure channel, consider LDPC codes having a degree distribution given as $\lambda(x) = \Sigma \lambda_k x^{k-1}$ and $\rho(x) = \Sigma \rho_k x^{k-1}$. In this equation, $\lambda_k$ is the probability that a connecting line selected arbitrarily in the graph becomes a connecting line connected to a variable node having a degree k, and meets a relationship equation of $\lambda_k = Cka_k$ with Equation 5. $\rho_k$ is probability that a connecting line selected arbitrarily in the graph becomes a connecting line connected to a check node having the degree k, and meets a relationship equation of $\rho_k = Ckb_k$ with Equation 5. Here, C is a normalization constant, yielding $\Sigma\lambda_k=1$. If decoding is performed using the belief propagation algorithm, the messages delivered between the variable nodes and the check nodes meet the following equation:

$$x_l = x_0\lambda(1-\rho(1-x_{l-1}))$$ [Equation 5]

In the above equation, $x_l$ is erasure message probability at the l-th iteration, $x_0$ is an initial value of this probability and $x_0=\delta$. If $x_l$ converges into 0 when l increases, it means that errors occurred in the data transmitted through a given channel are successfully corrected. The maximum value $\delta^*$ of the erasure probability leading to successful decoding is an index representing the performance of the code. $\delta^*$ always has a value smaller than $1-R$ with respect to a given code rate R.

The performance of the scale-free network based code calculated by the above-stated density evolution method is denoted in FIG. 3. In FIG. 3, a selected code rate, R=0.5. It can be seen that $\delta^*$ increases as the maximum degree $d_{max}$ increases, and $\delta^*$ substantially reaches $1-R$, which is a theoretical limit value of the performance, at a larger $d_{max}$.

To recognize the performance more specifically, comparison was made between the performance of the code according to the present invention and the performance of the Tornado code developed by Luby, et al., and the result of the comparison is given in Table 1.

TABLE 1

| $d_{max}$ | γ | α | Codes on SFN | | Tornado codes | |
|---|---|---|---|---|---|---|
| | | | $\delta^*$ | <k> | $\delta^*$ | <k> |
| 9 | 1.347 | −1.473 | 0.47875 | 2.97 | 0.44546 | 3 |
| 16 | 1.788 | −1.102 | 0.48633 | 3.30 | 0.46950 | 3.5 |
| 28 | 2.024 | −0.868 | 0.49163 | 3.57 | 0.48235 | 4 |
| 47 | 2.088 | −0.755 | 0.49477 | 3.88 | 0.48960 | 4.5 |
| 79 | 2.084 | −0.753 | 0.49689 | 4.24 | 0.49380 | 5 |
| 133 | 2.080 | −0.741 | 0.49810 | 4.60 | 0.49628 | 5.5 |
| 222 | 2.086 | −0.712 | 0.49862 | 4.94 | 0.49776 | 6 |
| 368 | 2.081 | −0.698 | 0.49895 | 5.31 | 0.49865 | 6.5 |
| 610 | 2.076 | −0.691 | 0.49920 | 5.68 | 0.49918 | 7 |
| 1009 | 2.073 | −0.687 | 0.49931 | 6.02 | 0.49951 | 7.5 |

As can be seen from Table 1, codes on scale-free networks (SFN) based code exhibits excellent performance over the Tornado codes in an area where $d_{max}$ is smaller than or equal to 610. In Table 1, <k> is an average degree of the variable node, which represents physical complexity of the graph. From the comparison at the same $d_{max}$ or performance, it can be seen that the physical complexity of the scale-free network based codes is lower than that of the Tornado codes, as shown in Table 1.

The scale-free network based LDPC code has another advantage that an iteration number required for decoding convergence is small. FIGS. 4a and 4b show an iteration number required for the decoding convergence of the scale-free network based LDPC codes and the Tornado codes. In FIG. 4a shows an iteration number required for the decoding convergence when dmax=610, and FIG. 4b shows an iteration number required for the decoding convergence when dmax=1009. Further, a dotted line represents an iteration number required for the decoding convergence of the Tornado codes, and a solid line represents an iteration number required for the decoding convergence of the scale-free network based LDPC codes. When dmax=610, the iteration number of the scale-free network based codes is smaller than that of the Tornado codes in all erasure probability regions, and even when dmax=1009, the iteration number of the codes suggested by the present invention is smaller than that of the Tornado codes over a broad area except for a section where $\delta$ is close to $\delta^*$.

Finally, the scale-free network based codes have a feature that it can take all integer values for $d_{max}$ at an arbitrary code rate, which is a property that the Tornado codes do not posses; the Tornado codes can take only a particular $d_{max}$ at a given code rate. This property allows for more flexibility in formulating the scale-free network based codes, compared with the Tornado codes.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 1 is a diagram for explaining LDPC code encoding;

DETAILED DESCRIPTION OF PREFERRED EMBODIMENTS

Hereinafter, preferred embodiments of the present invention will be described in detail with reference to the accompanying drawings. However, the embodiments of the present invention may be changed into several other forms, and it should not be construed that the scope of the present invention is limited to the embodiments described in detail below. The embodiments of the present invention are intended to explain the present invention more completely to those skilled in the art.

Figure 2:
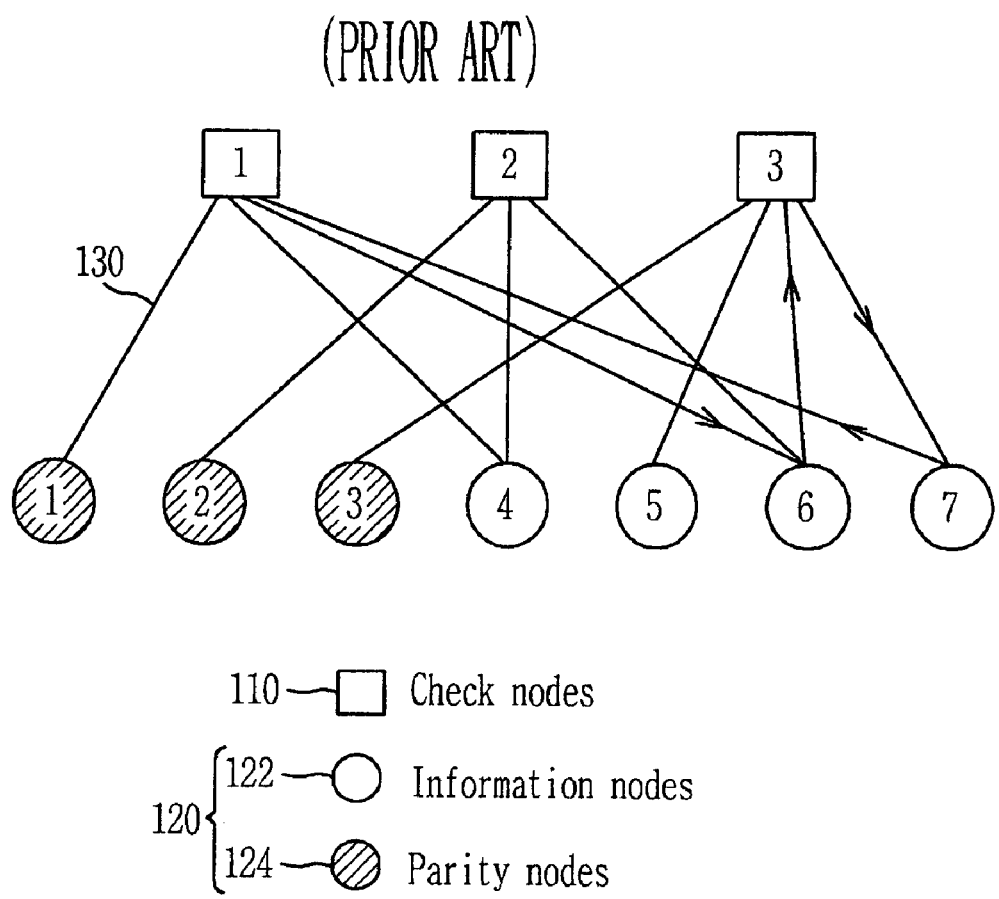
FIG. 2 is a diagram for explaining LDPC code decoding.
Figure 3:
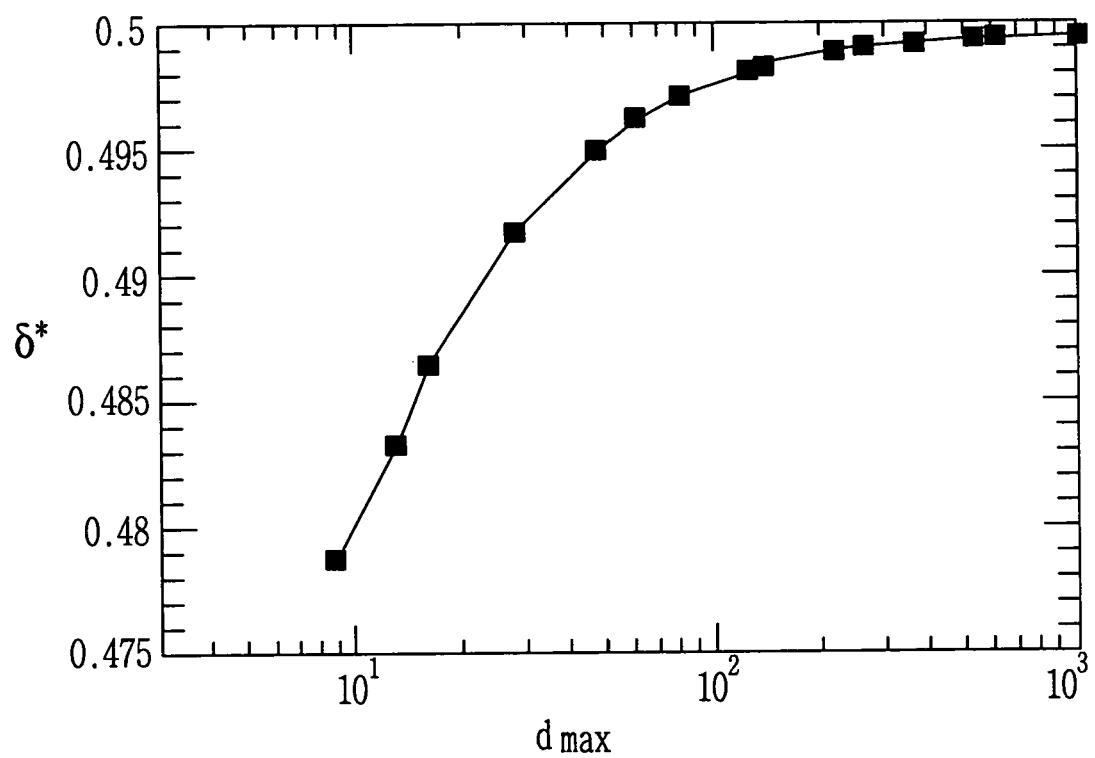
FIG. 3 is a graph illustrating the performance of scale-free network based codes calculated by the density evolution method.
Figure 4A:
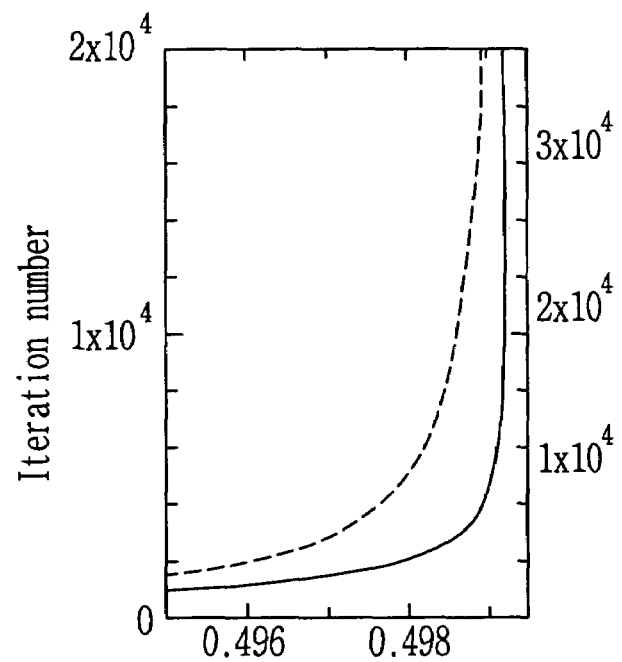
FIG. 4a and FIG. 4b are graphs showing an iteration number required for decoding convergence of scale-free network based LDPC codes and Tornado codes.
Figure 4B:
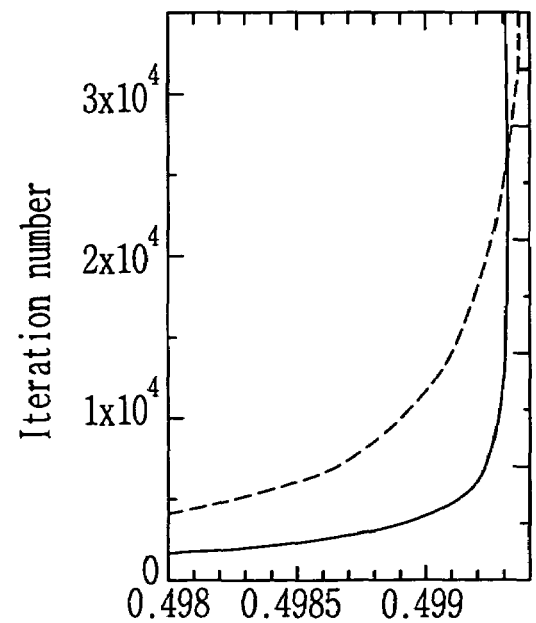
Figure 5:
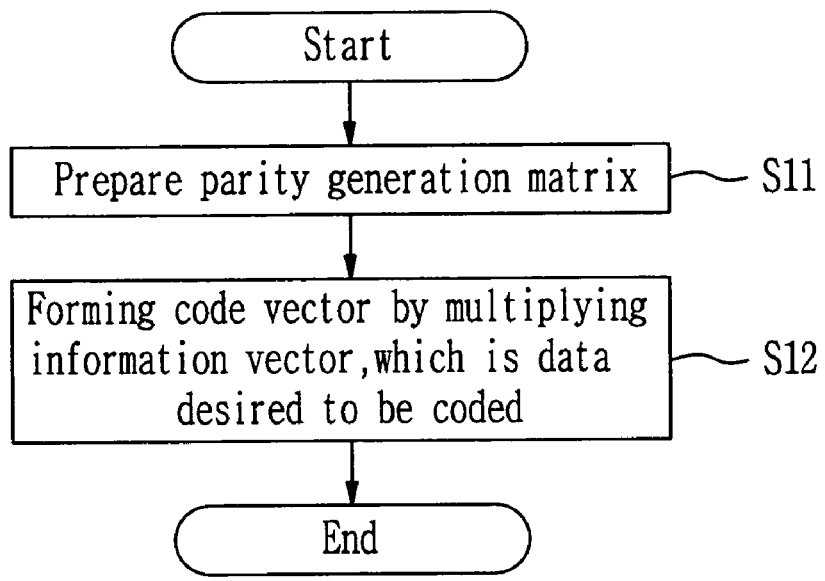
FIG. 5 is a flow diagram illustrating a method for coding scale-free network based LDPC codes according to the first embodiment of the present invention.

FIG. 5 is a flow diagram illustrating a method for coding scale-free network based LDPC codes according to the first embodiment of the present invention.

Referring to FIG. 5, a method for encoding LDPC codes includes a step S11 of preparing a parity generation matrix; and a step S12 of forming a code vector by multiplying an information vector, which is data desired to be coded, by the parity generation matrix. Here, the parity generation matrix satisfies the following Equation 6:

$$O = aGH^T,$$ [Equation 6]

where, O means a zero vector, a means an information vector, G means a parity generation matrix, and H means a parity check matrix. The parity check matrix has a degree distribution G(x) given by the following Equation 7 or 8:

$$G(x) = \sum_{k=2}^{d_i-1} a_k x^k + \sum_{k=d_i}^{d_{max}} Ck^{-\gamma} x^k \qquad \text{[Equation 7]}$$

where, G(x) is the degree distribution of the parity check matrix, $a_k$ is a parameter that corresponds to the probability that nodes of the graph have a degree k, C is a parameter that is determined by a normalization condition, G(1)=1, and $\alpha, \gamma$ are parameters that is optimized through numerical calculations.

$$G(x) = \sum_{k=2}^{d_{max}} C(k+\alpha)^{-\gamma} x^k \qquad \text{[Equation 8]}$$

where, G(x) is the degree distribution of the parity check matrix, $a_k$ is a parameter that corresponds to the probability that nodes of the graph have a degree k, C is a parameter that is determined by a normalization condition, G(1)=1, and $\alpha, \gamma$ are parameters that is optimized through numerical calculations.

The parity check matrix may be a parity check matrix having maximum performance selected from a plurality of parity check matrixes that meet the degree distribution of Equation 7 or 8. The performance of the parity check matrix may be calculated using the density evolution method.

Figure 6:
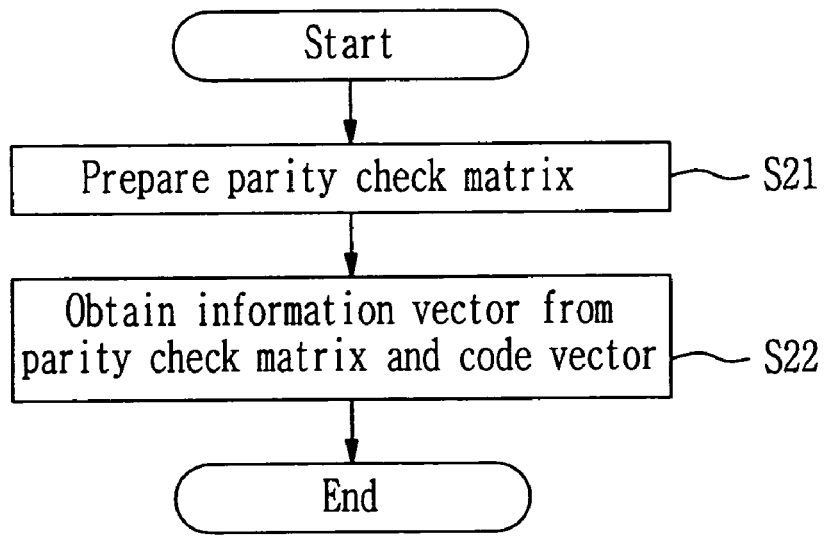
FIG. 6 is a flow diagram illustrating a method for decoding scale-free network based LDPC codes according to the second embodiment of the present invention.

FIG. 6 is a flow diagram illustrating a method for decoding scale-free network based LDPC codes according to the second embodiment of the present invention.

Referring to FIG. 6, a method for decoding LDPC codes includes a step S21 of preparing a parity check matrix, and a step S22 of obtaining an information vector from the parity check matrix and a code vector. Here, the degree distribution of the parity check matrix can meet Equation 7 or 8.

The parity check matrix may be a parity check matrix having maximum performance selected from a plurality of parity check matrixes that meet the degree distribution of Equation 7 or 8. The performance of the parity check matrix may be calculated using the density evolution method. Further, the step of obtaining the information vector from the parity check matrix and the code vector may be implemented using a commonly used belief propagation algorithm.

Figure 7:
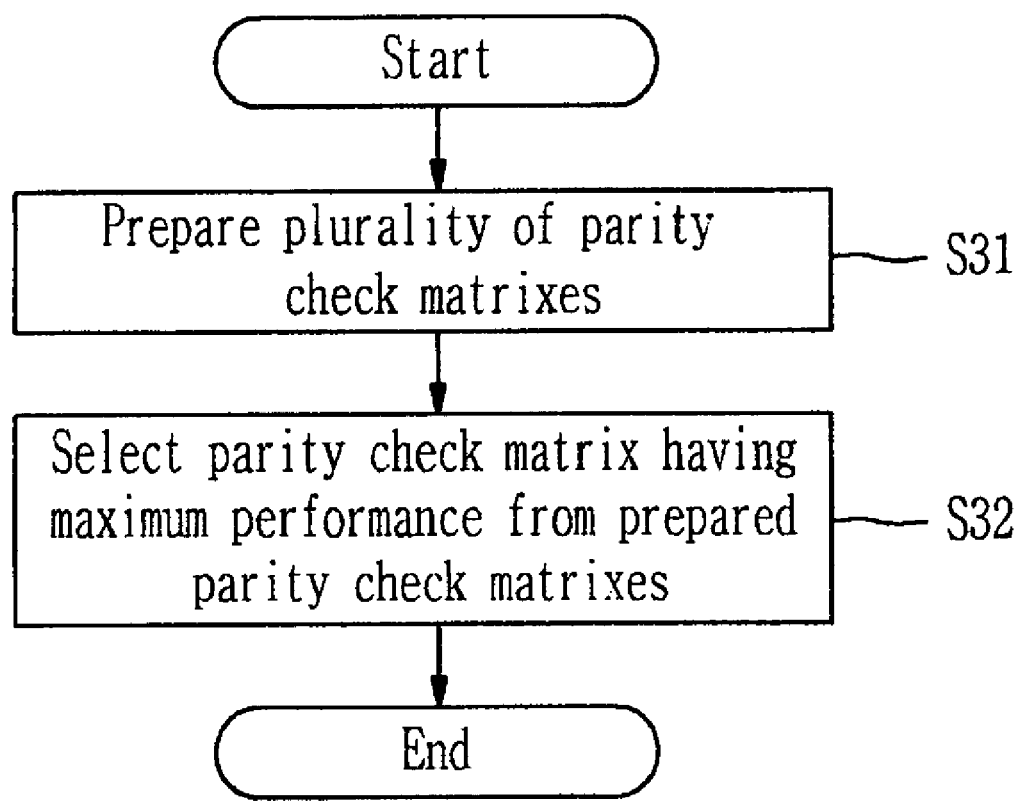
FIG. 7 is a flow diagram illustrating a method for forming a scale-free network based LDPC parity check matrix according to the third embodiment of the present invention.

FIG. 7 is a flow diagram illustrating a method for forming a scale-free network based LDPC parity check matrix according to the third embodiment of the present invention.

Referring to FIG. 7, a method for forming an LDPC parity check matrix includes a step S31 of preparing a plurality of parity check matrixes; and a step S32 of selecting a parity check matrix having maximum performance from the prepared parity check matrixes. Here, the parity check matrix may have a degree distribution that meets Equation 7 or 8.

The performance of the parity check matrix may be calculated using the density evolution method.

First, the present invention can significantly decrease a computational time required to find an optimal code in designing the LDPC codes since it uses a power-law distribution with a smaller number of parameters, as compared with an exhaustive numerical search for global optimization. Second, the present invention has an advantage that it exhibits more excellent performance for an erasure channel when the code has a maximum degree smaller than about 1000, as compared with the Tornado code. The present invention may be more useful in a situation where the physical complexity and maximum degree of the codes are restricted.

Third, the present invention has an advantage that it is capable of designing the code at all integer values of maximum degree for an arbitrarily given code rate. Thus, the present invention allows for a flexible code design without a restriction on the maximum size of the degree.

Fourth, the present invention has an advantage that it may be applied to various channels other than the erasure channel as they are.

Although the present invention has been described in detail by way of the detailed embodiments, the present invention is not limited to the embodiments, and it will be apparent that variations and modifications may be made to the present invention by those skilled in the art without departing from the technical spirit of the present invention.

What is claimed is:

1. A method for encoding LDPC codes, comprising the steps of:

preparing a parity generation matrix; and forming a code vector by multiplying an information vector, which is data desired to be coded, by the parity generation matrix, wherein the parity generation matrix meets the following Equation:

$O=aGH^T$, where, O is a zero vector, a is an arbitrary information vector, G is the parity generation matrix, and H is a parity check matrix, and wherein the parity check matrix has a degree distribution G(x) that meets the following Equation:

$$\sum_{k=2}^{d_i-1} a_k x^k + \sum_{k=d_i}^{d_{max}} Ck^{-\gamma} x^k,$$

where, $a_k$ is a parameter that corresponds to the probability that nodes of the graph have a degree k, C is a parameter that is determined by a normalization condition, G(1)=1, and $\gamma$ is a parameter that is optimized through numerical calculations.

2. The method according to claim 1, further comprising step of: calculating a performance of the parity check matrix by a density evolution method.

3. The method according to claim 2, wherein the parity check matrix is selected from a plurality of parity check matrixes that meet the degree distribution.

4. A method for coding LDPC codes, comprising the steps of:

preparing a parity generation matrix; and forming a code vector by multiplying an information vector, which is data desired to be coded, by the parity generation matrix, wherein the parity generation matrix meets the following Equation: $O=aGH^T$, where, O is a zero matrix, a is an arbitrary information vector, G is the parity generation matrix, and H is a parity check matrix, and wherein the parity check matrix has a degree distribution G(x) that meets the following Equation:

$$G(x) = \sum_{k=2}^{d_{max}} C(k+\alpha)^{-\gamma} x^k$$

where, C is a parameter that is determined by a normalization condition, $G(1)=1$, and $a\alpha$, $\gamma$ are parameters that are optimized through numerical calculations.

5. The method according to claim 4, further comprising step of: calculating a performance of the parity check matrix by a density evolution method.

6. The method according to claim 5, wherein the parity check matrix is selected from a plurality of parity check matrixes that meet the degree distribution.

7. A method for decoding LDPC codes, comprising the steps of:
preparing a parity check matrix; and
obtaining an information vector from the parity check matrix and a received code vector,
wherein the parity check matrix has a degree distribution $G(x)$ that meets the following Equation:

$$G(x) = \sum_{k=2}^{d_i-1} a_k x^k + \sum_{k=d_i}^{d_{max}} C k^{-\gamma} x^k$$

where, $a_k$ is a parameter that corresponds to the probability that nodes of the graph have a degree k, C is a parameter that is determined by a normalization condition, $G(1)=1$ and $\gamma$ is a parameter that is optimized through numerical calculations.

8. The method according to claim 7, further comprising step of: calculating a performance of the parity check matrix by a density evolution method.

9. The method according to claim 8, wherein the parity check matrix is selected from a plurality of parity check matrixes that meet the degree distribution.

10. A method for decoding LDPC codes, comprising the steps of:
preparing a parity check matrix; and
obtaining an information vector from the parity check matrix and a received code vector,
wherein the parity check matrix has a degree distribution $G(x)$ that meets the following Equation:

$$G(x) = \sum_{k=2}^{d_{max}} C(k+\alpha)^{-\gamma} x^k$$

where, C is a parameter that is determined by a normalization condition, $G(1)=1$, and $\gamma$ is a parameter that is optimized through numerical calculations.

11. The method according to claim 10, further comprising step of: calculating a performance of the parity check matrix by a density evolution method.

12. The method according to claim 11, wherein the parity check matrix is selected from a plurality of parity check matrixes that meet the degree distribution.

13. A method for forming an LDPC parity check matrix, comprising the steps of:
preparing a plurality of parity check matrixes; and
selecting a parity check matrix having maximum performance of the prepared parity check matrixes,
wherein the parity check matrix has a degree distribution $G(x)$ that meets the following Equation:

$$G(x) = \sum_{k=2}^{d_i-1} a_k x^k + \sum_{k=d_i}^{d_{max}} C k^{-\gamma} x^k$$

where, $a_k$ is a parameter that corresponds to the probability that nodes of the graph have a degree k, C is a parameter that is determined by a normalization condition, $G(1)=1$, and $\alpha$, $\gamma$ are parameters that is optimized through numerical calculations.

14. A method for forming an LDPC parity check matrix, comprising the steps of:
preparing a plurality of parity check matrixes; and
selecting a parity check matrix having maximum performance of the prepared parity check matrixes,
wherein the parity check matrix has a degree distribution $G(x)$ that meets the following Equation:

$$G(x) = \sum_{k=2}^{d_{max}} C(k+\alpha)^{-\gamma} x^k$$

where, C is a parameter that is determined by a normalization condition, $G(1)=1$, and $\alpha$, $\gamma$ are parameters that is optimized through numerical calculations.

* * * * *